(12) United States Patent
Smith

(10) Patent No.: US 7,589,550 B2
(45) Date of Patent: Sep. 15, 2009

(54) SEMICONDUCTOR DEVICE TEST SYSTEM HAVING REDUCED CURRENT LEAKAGE

(75) Inventor: Bradley P. Smith, Austin, TX (US)

(73) Assignee: Freescale Semiconductor, Inc., Austin, TX (US)

(*) Notice: Subject to any disclaimer, the term of this patent is extended or adjusted under 35 U.S.C. 154(b) by 213 days.

(21) Appl. No.: 11/851,738

(22) Filed: Sep. 7, 2007

(65) Prior Publication Data

US 2009/0066359 A1 Mar. 12, 2009

(51) Int. Cl.
*G01R 31/26* (2006.01)

(52) U.S. Cl. ...................................... 324/769

(58) Field of Classification Search ........................ None
See application file for complete search history.

(56) References Cited

U.S. PATENT DOCUMENTS

| | | | |
|---|---|---|---|
| 6,249,137 B1 | 6/2001 | Krieger et al. | |
| 6,329,831 B1 | 12/2001 | Bui et al. | |
| 6,621,743 B2 * | 9/2003 | Ogane | 365/185.23 |
| 6,801,050 B2 | 10/2004 | Takechi et al. | |
| 7,005,837 B2 * | 2/2006 | Stanescu et al. | 365/185.08 |
| 2003/0039143 A1 * | 2/2003 | Ogane | 365/185.23 |

OTHER PUBLICATIONS

PCT/US2008/070331 International Search Report and Written Opinion.
Gettings, Karen M.G.V. et al.; "Test Circuit for Study of CMOS Process Variation by Measurement of Analog Characteristics"; Mar. 19-22, 2007; pp. 37-41; IEEE.
Doong, Kelvin Y.Y. et al.; "Field-Configurable Test Structure Array (FC-TSA): Enabling design for monitor, model and manufacturability"; 2006; pp. 98-103; IEEE.
Ohkawa, Shin-Ichi et al.; "Analysis and Characterization of Device Variations in an LSI Chip Using an Integrated Device Matrix Array"; 2003; 6 pgs; IEEE.

* cited by examiner

*Primary Examiner*—Jermele M Hollington
(74) *Attorney, Agent, or Firm*—Robert L. King; James L. Clingan, Jr.

(57) ABSTRACT

A test circuit tests a device under test (DUT) uses a first switching device and a second switching device. The device under test (DUT) has a terminal for receiving a test signal. The first switching device has an output terminal for use in coupling the test signal to the terminal of the DUT when the DUT is being tested. The first switching device is high impedance when the DUT is not being tested. The second switching device is high impedance when the DUT is being tested and couples a bias control signal to the output terminal of the first switching device when the DUT is not being tested. The bias control signal substantially tracks the test signal. Leakage from the first switching device when other DUTs are being tested is greatly reduced because the bias control signal results in little or no bias across the first switching device.

20 Claims, 3 Drawing Sheets

SEMICONDUCTOR DEVICE TEST SYSTEM HAVING REDUCED CURRENT LEAKAGE

BACKGROUND

1. Field

This disclosure relates generally to semiconductors, and more specifically, to circuitry and a process for testing semiconductor device functionality.

2. Related Art

Transistors and other semiconductor devices are often tested for functional operating characteristics by placing such devices on a semiconductor wafer between integrated circuit die. Such transistors are tested prior to singulating the integrated circuit die and are efficient by not using the area within the integrated circuit. However, such known test devices have decided disadvantages. In one known implementation, each test device has one or more wafer probing pads which consume a large amount of area per test device. To reduce the total area required for multiple test devices, test devices have been connected together in parallel. In this parallel configuration the off-state leakage current is significant, thereby preventing the measurement of a single test device's leakage current. Additionally, a parallel test structure fails when only one of the test devices is faulty and causes an electrical short-circuit. Another alternative for implementing test devices is to use CMOS transmission gates to isolate test devices that are connected in parallel. Such transmission gates have lower leakage current when implemented with low-leakage transistors, such as those with thicker gate oxide. However, such low-leakage transmission gates add significant resistance and still have some non-zero leakage current that becomes significant when large numbers of test devices are connected in parallel. Therefore, the leakage current can become greater than the small current values desired to be measured.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
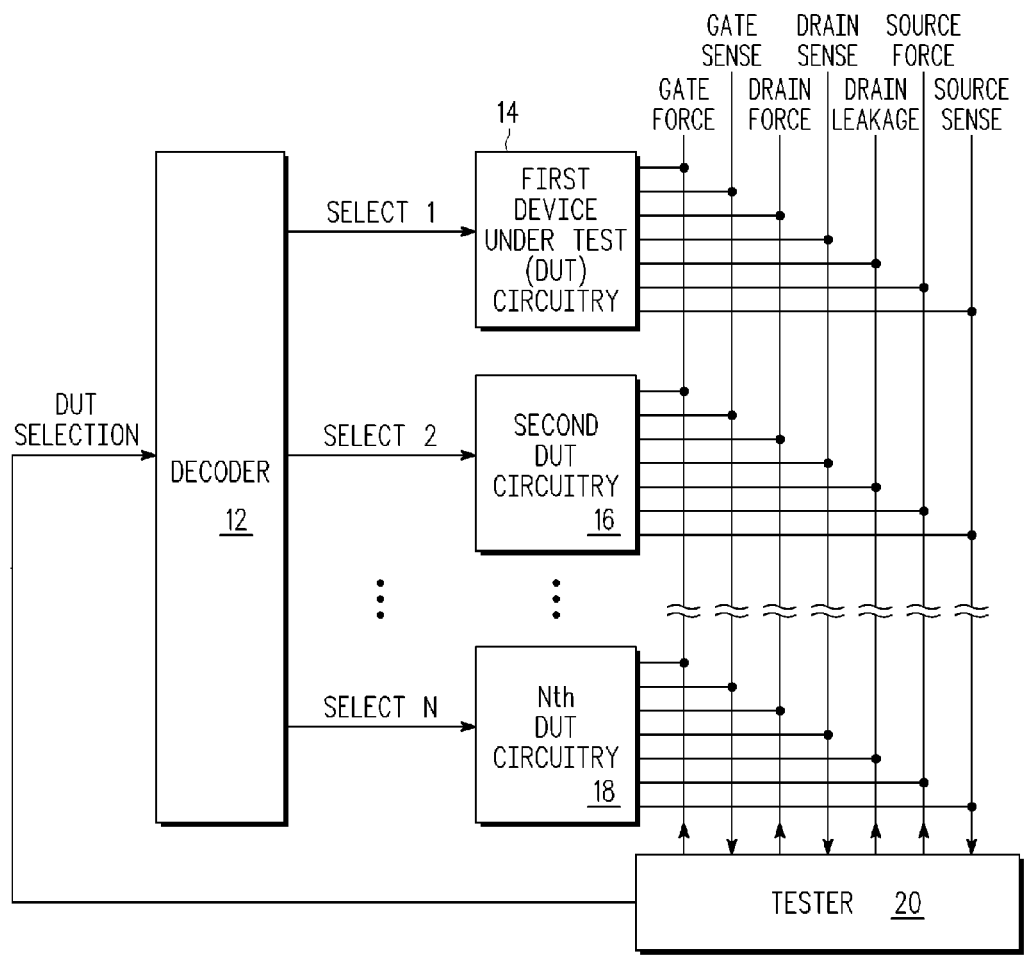
FIG. 1 illustrates in block diagram form a semiconductor test system for testing one or more semiconductor devices in accordance with the present invention.

Illustrated in FIG. 1 is a test system 10 for testing a plurality of devices under test (DUTs). Generally, a decoder 12 has an input connected to an output of a tester 20 for receiving a select signal labeled "DUT Selection". The decoder 12 has a plurality of outputs for providing N select signals, where N is an integer. A first select signal, Select 1, provided by the decoder 12 is connected to a first input of a first device under test (DUT) circuitry 14. A second select signal, Select 2, provided by the decoder 12 is connected to an input of a second device under test (DUT) circuitry 16. An Nth select signal, Select N, provided by the decoder 12 is connected to an input of a first device under test (DUT) circuitry 18. In the illustrated form any number of select signals, from one to N, may be provided by the decoder 12. The DUT circuitry 14 has outputs that are respectively connected to each of a plurality of buses. A first bus output of the DUT circuitry 14 is connected to a first bus that is a Gate Force bus for providing a Gate Force test signal. A second bus output of the DUT circuitry 14 is connected to a second bus that is a Gate Sense bus. A third bus output of the DUT circuitry 14 is connected to a third bus that is a Drain Force bus for providing a Drain Force test signal. A fourth bus output of the DUT circuitry 14 is connected to a fourth bus that is a Drain Sense bus. A fifth bus output of the DUT circuitry 14 is connected to a fifth bus that is a Drain Leakage bus for providing a Drain Leakage bias control signal. In one form the Drain Leakage bias control signal is a DC bias voltage. A sixth bus output of the DUT circuitry 14 is connected to a sixth bus that is a Source Force bus. A seventh bus output of the DUT circuitry 14 is connected to a seventh bus that is a Source Sense bus. A second output of the tester 20 is connected to the Gate Force bus. A third output of the tester 20 is connected to the Drain Force bus. A fourth output of the tester 20 is connected to the Drain Leakage bus and a fifth output of the tester 20 is connected to the Source Force bus. A first input of the tester 20 is connected to the Gate Sense bus. A second input of the tester 20 is connected to the Drain Sense bus, and a third input of the tester 20 is connected to the Source Sense bus.

Test system 10 further has a second DUT circuitry 16. The DUT circuitry 16 also has outputs that are respectively connected to each of the plurality of buses. A first bus output of the DUT circuitry 16 is connected to the Gate Force bus. A second bus output of the DUT circuitry 16 is connected to the Gate Sense bus. A third bus output of the DUT circuitry 16 is connected to the Drain Force bus. A fourth bus output of the DUT circuitry 16 is connected to the Drain Sense bus. A fifth bus output of the DUT circuitry 16 is connected to the Drain Leakage bus. A sixth bus output of the DUT circuitry 16 is connected to the Source Force bus. A seventh bus output of the DUT circuitry 16 is connected to a seventh bus that is a Source Sense bus. Test system 10 further has any predetermined number of additional DUT circuitry. In the illustrated form a last or Nth DUT circuitry 16 has outputs that are respectively connected to each of the plurality of buses. A first bus output of the Nth DUT circuitry 18 is connected to the Gate Force bus. A second bus output of the Nth DUT circuitry 18 is connected to the Gate Sense bus. A third bus output of the Nth DUT circuitry 18 is connected to the Drain Force bus. A fourth bus output of the Nth DUT circuitry 18 is connected to the Drain Sense bus. A fifth bus output of the Nth DUT circuitry 18 is connected to the Drain Leakage bus. A sixth bus output of the Nth DUT circuitry 18 is connected to the Source Force bus. A seventh bus output of the Nth DUT circuitry 18 is connected to a seventh bus that is a Source Sense bus.

In the illustrated form each of the DUT circuitry 14, the DUT circuitry 16 and the Nth DUT circuitry 18 includes a semiconductor device that is to be tested by bias conditions applied from the tester 20. In the FIG. 1 form an MOS (metal oxide semiconductor) transistor is used as the device under test. The gate force signal, the drain force signal and the source force signal apply a predetermined bias voltage to respective gate, drain and source electrodes of the MOS transistor under test in each of the DUT circuitry 14, the DUT circuitry 16 and the Nth DUT circuitry 18. The tester 20 functions to select one of the DUT circuitry 14, the DUT circuitry 16 and the Nth DUT circuitry 18 at a time to test for functionality by use of the DUT selection signals. Each DUT selection signal may be either a multiple-bit signal or a single-bit signal. In one form each DUT selection signal is a single-bit address and decoder 12 decodes the single-bit address to enable one of the select signals. The tester 20 is an analog tester and functions to receive the gate voltage via the Gate Sense bus, the drain voltage via the Drain Sense bus and the source voltage via the Source Sense bus. In addition, the tester 20 may sense the current flowing to/from the Drain Force bus and the Source Force bus. These voltages and currents associated with a predetermined MOS transistor can enable the tester 20 to determine various operating parameters of the MOS transistor such as the drive current, threshold voltage, sub-threshold slope and leakage current. Details associated with how to minimize the parasitic drain current leakage under test of the MOS transistor are provided in FIG. 2 below. In the illustrated form of FIG. 1 it will be understood below that a large number of DUTs may be efficiently implemented and that various types of devices may be tested. In one form, a portion of the test system 10 is implemented on a semiconductor wafer in the regions between semiconductor die (integrated circuit die). In such a form the tester 20 is implemented external to the semiconductor wafer and the DUTs that are being tested are positioned close on the semiconductor wafer to semiconductor die functional circuitry of the same type to get an understanding of the device characteristics within the semiconductor die. In this form the DUTs are within a wafer scribe region which is the region separating semiconductor die on a wafer and which typically get cut when the semiconductor die are singulated. However, it should be understood that various locations of the tester and the DUT circuitry may be implemented. For example, the DUT circuitry 14-16 may be implemented within a semiconductor die rather than within a wafer scribe region.

Figure 2:
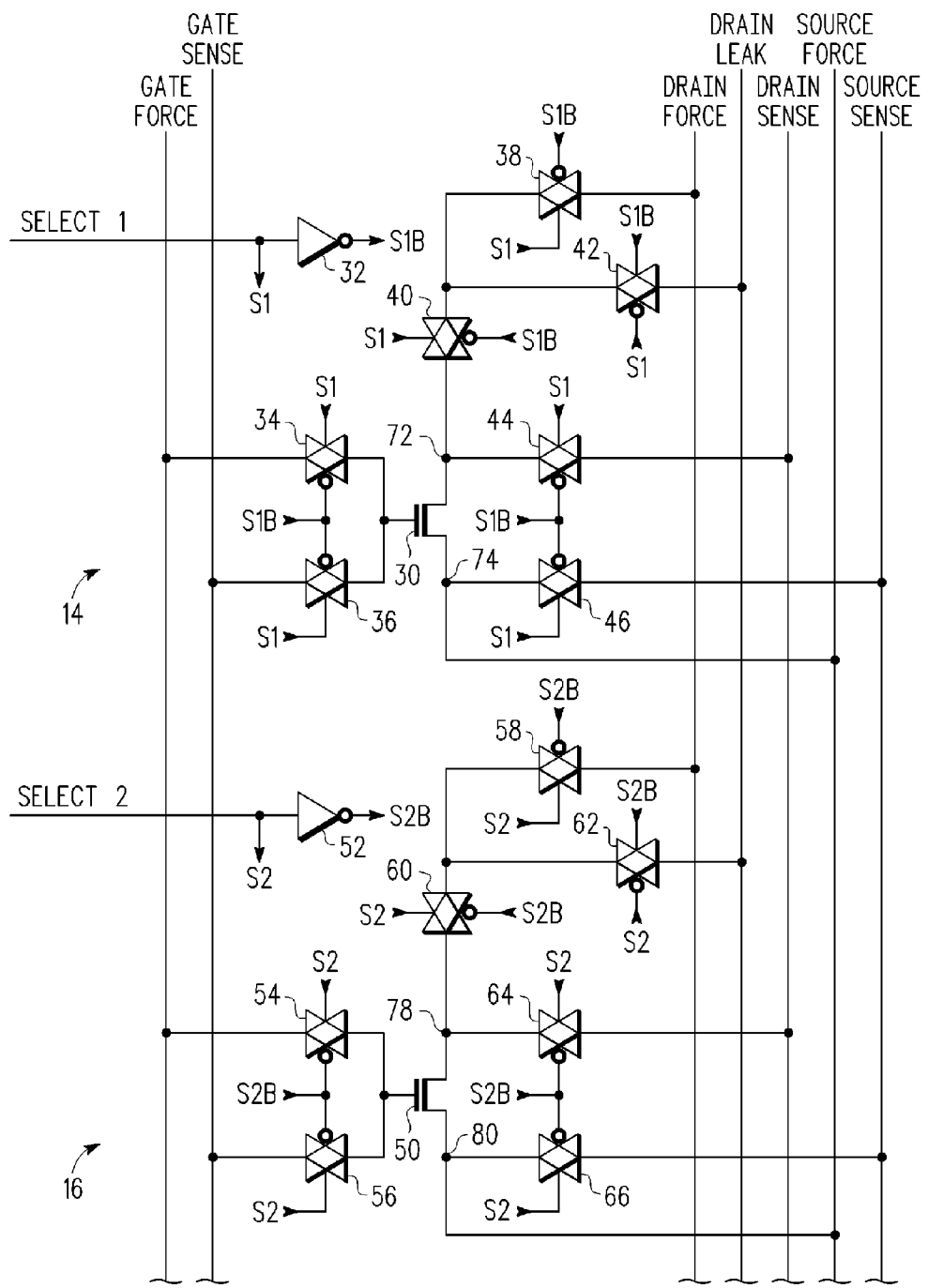
FIG. 2 illustrates in schematic form one form of device under test (DUT) circuitry in accordance with the present invention.

Illustrated in FIG. 2 is further detail of one form of the DUT circuitry 14 and the DUT circuitry 16 of the test system 10 of FIG. 1. In the illustrated form the DUT of the DUT circuitry 14 is an MOS transistor 30 and the DUT of the DUT circuitry 16 is an MOS transistor 50. In the illustrated form the MOS transistors 30 and 50 are both N-channel transistors. The Gate Force, Gate Sense, Drain Force, Drain Leak, Drain Sense, Source Force and Source Sense buses of FIG. 1 are similarly labeled in FIG. 2. The Select 1 signal of FIG. 1 is represented as signal S1 and is complemented to form signal S1B by an inverter 32. Similarly, the Select 2 signal of FIG. 1 is represented as signal S2 and is complemented to form signal S2B by an inverter 52.

A switching device 34 has a first terminal connected to the Gate Force bus and a second terminal connected to a gate of MOS transistor 30. In the illustrated form the switching devices that are illustrated herein are implemented as CMOS (complementary metal oxide semiconductor) switches or transmission gates and are conventional switching devices. An NMOS or first control terminal of switching device 34 is connected to signal S1, and a PMOS or second control terminal of switching device 34 is connected to signal S1B. Similarly, a switching device 36 has a first terminal connected to the Gate Sense bus and a second terminal connected to the gate of MOS transistor 30. An NMOS or first control terminal of switching device 36 is connected to signal S1, and a PMOS or second control terminal of switching device 36 is connected to signal S1B. A switching device 38 has a first terminal connected to the Drain Force bus and a second terminal connected to a first terminal of a switching device 40. An NMOS or first control terminal of switching device 38 is connected to signal S1, and a PMOS or second control terminal of switching device 38 is connected to signal S1B. A switching device 42 has a first terminal connected to the Drain Leak bus and a second terminal connected to the second terminal of switching device 38. An NMOS or first control terminal of switching device 42 is connected to signal S1B, and a PMOS or second control terminal of switching device 42 is connected to signal S1. A second terminal of switching device 40 is connected to the drain of MOS transistor 30 at a node 72. An NMOS or first control terminal of switching device 40 is connected to signal S1, and a PMOS or second control terminal of switching device 40 is connected to signal S1B. A switching device 44 has a first terminal connected to the Drain Sense bus and a second terminal connected to node 72. An NMOS or first control terminal of switching device 44 is connected to signal S1, and a PMOS or second control terminal of switching device 44 is connected to signal S1B. A switching device 46 has a first terminal connected to the Source Sense bus and a second terminal connected to the source of MOS transistor 30 at a node 74. An NMOS or first control terminal of switching device 46 is connected to signal S1, and a PMOS or second control terminal of switching device 46 is connected to signal S1B. The Source Force bus is connected to node 74.

A switching device 54 has a first terminal connected to the Gate Force bus and a second terminal connected to a gate of MOS transistor 50. An NMOS or first control terminal of switching device 54 is connected to signal S2, and a PMOS or second control terminal of switching device 54 is connected to signal S2B. Similarly, a switching device 56 has a first terminal connected to the Gate Sense bus and a second terminal connected to the gate of MOS transistor 50. An NMOS or first control terminal of switching device 56 is connected to signal S2, and a PMOS or second control terminal of switching device 56 is connected to signal S2B. A switching device 58 has a first terminal connected to the Drain Force bus and a second terminal connected to a first terminal of a switching device 60. An NMOS or first control terminal of switching device 58 is connected to signal S2, and a PMOS or second control terminal of switching device 58 is connected to signal S2B. A switching device 62 has a first terminal connected to the Drain Leak bus and a second terminal connected to the second terminal of switching device 58. An NMOS or first control terminal of switching device 62 is connected to signal S2B, and a PMOS or second control terminal of switching device 62 is connected to signal S2. A second terminal of switching device 60 is connected to the drain of MOS transistor 50 at a node 78. An NMOS or first control terminal of switching device 60 is connected to signal S2, and a PMOS or second control terminal of switching device 60 is connected to signal S2B. A switching device 64 has a first terminal connected to the Drain Sense bus and a second terminal connected to node 78. An NMOS or first control terminal of switching device 64 is connected to signal S2, and a PMOS or second control terminal of switching device 64 is connected to signal S2B. A switching device 66 has a first terminal connected to the Source Sense bus and a second terminal connected to the source of MOS transistor 50 at a node 80. An NMOS or first control terminal of switching device 66 is connected to signal S2, and a PMOS or second control terminal of switching device 66 is connected to signal S2B. The Source Force bus is connected to node 80.

In operation, assume that the Select 1 signal is asserted and that the Select 2 signal is not asserted. When Select 1 signal is asserted, a selected mode of operation exists for the DUT MOS transistor 30. Similarly, a non-selected mode of operation exists for the DUT MOS transistor 50. As a result the signal S1 is at a logic high level and signal S1B is at a logic low level. Similarly, signal S2 is at a logic low level and signal S2B is at a logic high level. Under these biasing conditions, switching devices 34, 36, 38, 40, 44 and 46 are conductive within the DUT circuitry 14 and only switching device 42 is nonconductive. Within the DUT circuitry 16, switching devices 54, 56, 58, 60, 64 and 66 are not conductive. Switching device 62 is conductive. Therefore as a result of these switching configurations, none of the Gate Force bus, the Gate Sense bus, the Drain Force bus, the Drain Sense bus or the Source Sense bus is connected to the DUT MOS transistor 50. However the Drain Leak bus is connected to the second terminal of switching device 58 through switching device 62. The purpose of the Drain Leak bus is to place a voltage potential on the second terminal of switching device 58 that is substantially the same as or similar to the voltage potential of the Drain Force bus which the first terminal of switching device 58 is connected to. The drain/source bias component of the leakage current of switching device 58 is removed by the action of switching device 62. As a result, there is significantly less leakage current that is conducted by switching device 58. Additionally, switching devices 60 and 64 are nonconductive. While switching device 60 will also have a nominal amount of leakage current, that leakage current detectable on the Drain Force bus is limited by the leakage of switching device 58.

Within the DUT circuitry 14 each of the Gate Force bus, the Gate Sense bus, the Drain Force bus, the Drain Sense bus and the Source Sense bus are electrically connected to the DUT MOS transistor 30 via switching devices 34, 36, 38, 44 and 46, respectively. The Source Force bus is hard-wire connected to the source of the DUT MOS transistor 30. Switching device 42 is nonconductive and thus the Drain Leak bus is not connected to the drain of the DUT MOS transistor 30. In the selected mode of operation a predetermined bias is applied to the DUT MOS transistor 30 by the tester 20 which also measures the voltages and currents of each bus. If the predetermined gate bias is zero volts and a higher voltage is applied to the drain, any drain current that is measured is considered to be a leakage current for that DUT MOS transistor. The cumulative parasitic leakage current on the Drain Force bus determines the minimum leakage current for the selected DUT MOS transistor 30 that can measured. As stated above, the addition of switching device 62 significantly lowers the parasitic current leakage of switching device 58.

Thus the leakage current that can be measured for MOS transistor 30 is significantly lower than what would otherwise have been possible to measure if switching device 62 were not present. Another advantage that the use of switching device 62 provides is that a larger number of additional DUT circuitry can be directly connected to transistor test buses. Since the leakage current per DUT drops, more DUTs can be added to the test system while not exceeding the original amount of leakage current that would have been present without switching device 62.

Figure 3:
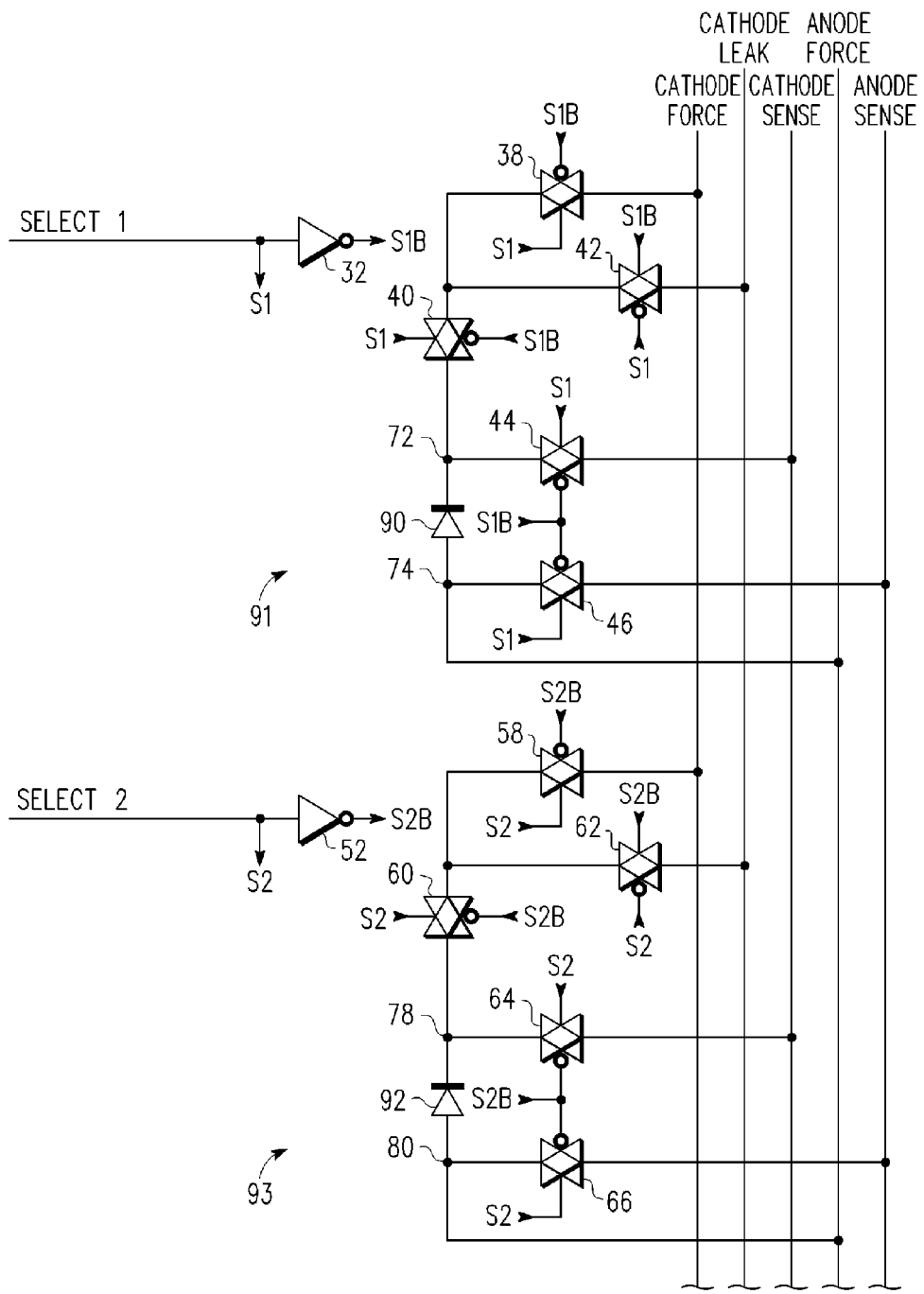
FIG. 3 illustrates in schematic form another form of device under test (DUT) circuitry in accordance with the present invention.

Illustrated in FIG. 3 is another form of DUT circuitry for use in test system 10. For convenience of illustration, elements in FIG. 3 that are common with the elements of FIG. 1 are assigned the same reference number. Inverter 32 receives signal S1 and provides signal S1B. A DUT circuitry 91 has a diode 90 to be tested and a DUT circuitry 93 has a diode 92 to be tested. In the illustrated form switching devices 38, 40 and 42 are connected as in FIG. 1 with several exceptions. A second terminal of switching device 40 is connected to node 72 and to a cathode of diode 90. The Drain Force bus, Drain Leak bus, Drain Sense bus, Source Force bus and Source Sense bus are replaced with a Cathode Force bus, a Cathode Leak bus, a Cathode Sense bus, an Anode Force bus and an Anode Sense bus. A first terminal switching device 38 is connected to the Cathode Force bus. A first terminal of switching device 42 is connected to the Cathode Leak bus. A first terminal of switching device 44 is connected to the Cathode Sense bus. A first terminal of switching device 46 is connected to the Anode Sense bus and the second terminal thereof is connected to node 74 and to the Anode Force bus. An anode of diode 90 is connected to node 74. Further, with the use of diode 90 rather than MOS transistor 30, switching devices 34 and 36 and the Gate Force and Gate Sense buses are removed.

Within the DUT circuitry 93, diode 92 has a cathode that is connected to node 78 and has an anode connected to node 80. Inverter 52 receives signal S2 and provides signal S2B. A first terminal of switching device 58 is connected to the Cathode Force bus. A first terminal of switching device 64 is connected to the Cathode Sense bus. A first terminal of switching device 62 is connected to the Cathode Leak bus. A first terminal of switching device 66 is connected to the Anode Sense bus, and a second terminal of switching device 66 is connected to node 80 and to the Anode Force bus. A second terminal of switching device 58 is connected to a first terminal of switching device 60. A second terminal of switching device 62 is also connected to the first terminal of switching device 60. A second terminal of switching device 60 is connected to node 78 and to the cathode of diode 92. A second terminal of switching device 64 is connected to node 78. Each of switching devices 38, 40, 42, 44, 46, 58, 60, 62, 64 and 66 are CMOS transmission gates having complementary control inputs (i.e. first and second control inputs or N-conductivity and P-conductivity control inputs) for respectively receiving the same complementary select control signals as each did in FIG. 2. The N-conductivity control input of all of the switching devices except switching device 42 and switching device 62 receives control signal S1. The N-conductivity control input of switching device 42 and switching device 62 receives control signal S1B.

In operation assume that the Select 1 signal is asserted and that the Select 2 signal is not asserted. When Select 1 signal is asserted, a selected mode of operation exists for the diode 90. Similarly, a non-selected mode of operation exists for the diode 92. As a result the signal S1 is at a logic high level and signal S1B is at a logic low level. Similarly, signal S2 is at a logic low level and signal S2B is at a logic high level. Under these biasing conditions, switching devices 38, 40, 44 and 46 are conductive within the DUT circuitry 91 and only switching device 42 is nonconductive. Within the DUT circuitry 93, switching devices 58, 60, 64 and 66 are not conductive. Switching device 62 is conductive. Therefore as a result of these switching configurations none of the Cathode Force bus, the Cathode Sense bus, the Anode Sense bus or the Cathode Leak bus is connected to the diode 92. However the Cathode Leak bus is connected to the second terminal of switching device 58. The purpose of the Cathode Leak bus is to place a voltage potential on the second terminal of switching device 58 that is substantially the same as or similar to the voltage potential of the Cathode Force bus which the first terminal of switching device 58 is connected to. The drain/source bias component of the leakage current of switching device 58 is removed by the action of switching device 62. As a result, there is significantly less leakage current that is conducted by switching device 58. Additionally, switching devices 60 and 64 are nonconductive. While switching device 60 will also have a nominal amount of leakage current, that leakage current detectable on the Cathode Force bus is limited by the leakage of switching device 58.

Within the DUT circuitry 91 each of the Cathode Force bus, the Cathode Sense bus and the Anode Sense bus are electrically connected to the diode 90 via switching devices 38, 44 and 46, respectively. Switching device 42 is nonconductive and thus the Cathode Leak bus is not connected to the cathode of the diode 90. In the selected mode of operation a predetermined bias is applied to the diode 90 by the tester 20 which also measures the voltages and currents of each bus. As stated above, the addition of switching device 62 significantly lowers the parasitic current leakage of switching device 58. Thus the leakage current is significantly lower than what would otherwise have been possible to measure if switching device 62 were not present. Another advantage that the use of switching device 62 provides is that a larger number of additional DUT circuitry can be directly connected to diode test buses. Since the leakage current per DUT drops, more DUTs can be added to the test system while not exceeding the original amount of leakage current that would have been present without switching device 62.

By now it should be appreciated that there has been provided a biasing method to reduce leakage currents associated with switching devices in a test circuit. By minimizing leakage current using switching devices, such as pass gates or transmission gates, any of a large number of DUTs can be selected for testing while electrically isolating the other DUTs. The leakage current compensation technique that is used on those DUTs that are not selected prevents a current drain from the test sensing buses, such as those illustrated in each of FIGS. 1-3. Therefore, the currents which are measured by a tester are more accurate. The minimization of leakage current in non-selected DUTs enables more accurate measurement of all DC (direct current) parameters of a large number of DUTs connected to the same buses. Numerous embodiments described herein may be used and the selection of which embodiment may depend upon processing requirements and desired semiconductor device specifications.

In one form there is herein provided a test circuit having a device under test (DUT) having a terminal for receiving a test signal. A first switching device has an output terminal for use in coupling the test signal to the terminal of the DUT when the DUT is being tested. The first switching device has high impedance when the DUT is not being tested. A second switching device has high impedance when the DUT is being tested and couples a bias control signal to the output terminal of the first switching device when the DUT is not being tested. The bias control signal substantially tracks the test signal. In another form the test circuit further includes a third switching device for coupling the test signal from the first switching device to the terminal of the DUT when the DUT is being tested and for being high impedance when the DUT is not being tested. In one form the first switching device is a first transmission gate having an input terminal for receiving the test signal and control terminal for receiving a select signal that indicates if the DUT has been selected for being tested. In another form the DUT is a transistor having a drain as the terminal, a source coupled to ground, and a gate for receiving a gate force signal when the DUT is being tested. In another form the test circuit includes a second transmission gate having a signal input terminal for receiving the gate force signal, a signal output coupled to the gate, and a control terminal coupled to the control terminal of the first transmission gate. In yet another form the test circuit has a third transmission gate having a signal input terminal coupled to the drain, an output for providing a drain sense signal, and a control terminal coupled to the control terminal of the first transmission gate. In one form the second switching device is a fourth transmission gate having a signal input terminal for receiving the bias control signal, an output coupled to the output of the first switching device, and a control terminal for receiving a signal complementary to the select signal. In another form the fourth transmission gate has a complementary control terminal for receiving the select signal. In another form the DUT is a diode. In yet another form the test signal is a first DC bias voltage of a first magnitude and the bias control signal is a second DC bias voltage of substantially the first magnitude.

In another form there is provided a method of testing a first device under test (DUT) having a terminal and a second DUT having a terminal. A test signal is applied to a first terminal of a first switching device and a first terminal of a second switching device. The test signal is applied to the terminal of the first DUT from a second terminal of the first switching device when the first DUT is being tested. The test signal is applied to the terminal of the second DUT from a second terminal of the second switching device when the second DUT is being tested. A leakage control signal is applied that substantially tracks the test signal to the second terminal of the first switching device when the second DUT is being tested. The leakage control signal is applied to the second terminal of the second switching device when the first DUT is being tested. In another form the bias control signal is blocked from the terminal of the first DUT when the second DUT is being tested. The bias control signal is blocked from the terminal of the second DUT when the first DUT is being tested. In another form the first DUT is a first transistor and the second DUT is a second transistor. A disabling bias is applied to a gate of the first transistor when the first transistor is being tested. The disabling bias is applied to a gate of the second transistor when the second transistor is being tested. A voltage present on the terminal of the first DUT is measured when the first DUT is being tested. A voltage on the terminal of the second DUT is measured when the second DUT is being tested. In one form applying a test signal to a first terminal of a first switching device is implemented by the first switching device having a transmission gate. In another form the terminal of the first DUT that the test signal is applied to is a cathode of a diode. In another form applying a leakage control signal that substantially tracks the test signal to the second terminal of the first switch when the second DUT is being tested is performed by the leakage control signal having a voltage level higher than that of the test signal.

In yet another form there is provided a test circuit having a first device under test (DUT) having a first terminal coupled to a reference terminal and having a second terminal. A first switching device has a control input for receiving a first select signal, a signal input for receiving a test signal, and a signal output coupled to the second terminal of the first DUT. A second switching device has a control input for receiving a complement of the first select signal, a signal input for receiving a leakage control signal, and a signal output coupled to the output terminal of the first switching device. A second DUT has a first terminal coupled to the reference terminal and a second terminal. A third switching device has a control input for receiving a second select signal, a signal input for receiving the test signal, and a signal output coupled to the second terminal of the second DUT. A fourth switching device has a control input for receiving a complement of the second select signal, a signal input for receiving the leakage control signal, and a signal output coupled to the output terminal of the third switching device. In another form there is provided a fifth switching device coupled between the first switching device and the terminal of the first DUT. The fifth switching device has a signal input coupled to the output terminal of the first switching device, a signal output coupled to the terminal of the first DUT, and a control input for receiving the first select signal. A sixth switching device is coupled between the third switching device and the terminal of the second DUT. The sixth switching device has a signal input coupled to the output terminal of the third switching device, a signal output coupled to the terminal of the second DUT, and a control input for receiving the second select signal. In one form the first, second, third, fourth, fifth, and sixth switching devices each have a complementary control input. The complementary control inputs of the first and fifth switching devices are for receiving the complement of the first select signal. The complementary control inputs of the third and sixth switching devices are for receiving the complement of the second select signal. The complementary control input of the second switching device is for receiving the first select signal, and the complementary control input of the fourth switching device is for receiving the second select signal.

Although the invention has been described with respect to specific conductivity types or polarity of potentials, skilled artisans appreciated that conductivity types and polarities of potentials may be reversed. Moreover, the terms "front," "back," "top," "bottom," "over," "under", "above", "below" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, embodiments that are discussed apply to both N-channel transistors and P-channel transistors. While N-channel transistor embodiments are illustrated, it should be understood that modifications regarding the logic value of control signals may be readily made to account for a change in conductivity when P-channel transistor embodiments are used. Various types of devices under test may be used in addition to transistors and diodes. For example, resistors, capacitors, inductors, thyristors and other semiconductor devices may be used as a DUT. When transistors are used, each transistor may represent a transistor in an addressable array in one form.

The terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

What is claimed is:

1. A test circuit, comprising:
    a device under test (DUT) having a terminal for receiving a test signal;
    a first switching device having an output terminal for use in coupling the test signal to the terminal of the DUT when the DUT is being tested and for being high impedance when the DUT is not being tested; and
    a second switching device for being high impedance when the DUT is being tested and for coupling a bias control signal to the output terminal of the first switching device when the DUT is not being tested, wherein the bias control signal substantially tracks the test signal.

2. The test circuit of claim 1, further comprising:
    a third switching device for coupling the test signal from the first switching device to the terminal of the DUT when the DUT is being tested and for being high impedance when the DUT is not being tested.

3. The test circuit of claim 1, wherein the first switching device comprises a first transmission gate having an input terminal for receiving the test signal and control terminal for receiving a select signal that indicates if the DUT has been selected for being tested.

4. The test circuit of claim 3, wherein:
    the DUT comprises a transistor having a drain as the terminal, a source coupled to ground; and gate for receiving a gate force signal when the DUT is being tested.

5. The test circuit of claim 4, further comprising a second transmission gate having a signal input terminal for receiving the gate force signal, a signal output coupled to the gate, and a control terminal coupled to the control terminal of the first transmission gate.

6. The test circuit of claim 5, further comprising a third transmission gate having a signal input terminal coupled to the drain, an output for providing a drain sense signal, and a control terminal coupled to the control terminal of the first transmission gate.

7. The test circuit of claim 6, wherein the second switching device comprises a fourth transmission gate having a signal input terminal for receiving the bias control signal, an output coupled to the output of the first switching device, and a control terminal for receiving a signal complementary to the select signal.

8. The test circuit of claim 7, wherein the fourth transmission gate has a complementary control terminal for receiving the select signal.

9. The test circuit of claim 1, wherein the DUT comprises a diode.

10. The test circuit of claim 1, wherein the test signal is a first DC bias voltage of a first magnitude and the bias control signal is a second DC bias voltage of substantially the first magnitude.

11. A method of testing a first device under test (DUT) having a terminal and a second DUT having a terminal, comprising:
    applying a test signal to a first terminal of a first switching device and a first terminal of a second switching device;
    applying the test signal to the terminal of the first DUT from a second terminal of the first switching device when the first DUT is being tested;
    applying the test signal to the terminal of the second DUT from a second terminal of the second switching device when the second DUT is being tested;
    applying a leakage control signal that substantially tracks the test signal to the second terminal of the first switching device when the second DUT is being tested; and
    applying the leakage control signal to the second terminal of the second switching device when the first DUT is being tested.

12. The method of claim 11, further comprising
blocking the bias control signal from the terminal of the first DUT when the second DUT is being tested; and
blocking the bias control signal from the terminal of the second DUT when the first DUT is being tested.

13. The method of claim 12, wherein the first DUT is a first transistor and the second DUT is a second transistor, further comprising:
applying a disabling bias to a gate of the first transistor when the first transistor is being tested; and
applying the disabling bias to a gate of the second transistor when the second transistor is being tested.

14. The method of claim 11, further comprising:
measuring a voltage present on the terminal of the first DUT when the first DUT is being tested; and
measuring a voltage on the terminal of the second DUT when the second DUT is being tested.

15. The method of claim 11, wherein the step of applying a test signal to a first terminal of a first switching device is further characterized by the first switching device comprising a transmission gate.

16. The method of claim 11, the step of applying the test signal to the terminal of the first DUT is further characterized by the terminal of the first DUT being a cathode of a diode.

17. The method of claim 11, wherein the step of applying a leakage control signal that substantially tracks the test signal to the second terminal of the first switching device when the second DUT is being tested is further characterized by the leakage control signal having a voltage level higher than that of the test signal.

18. A test circuit, comprising:
a first device under test (DUT) having a first terminal coupled to a reference terminal and a second terminal;
a first switching device having a control input for receiving a first select signal, a signal input for receiving a test signal, and a signal output coupled to the second terminal of the first DUT;
a second switching device having a control input for receiving a complement of the first select signal, a signal input for receiving a leakage control signal, and a signal output coupled to the signal output of the first switching device;
a second DUT having a first terminal coupled to the reference terminal and a second terminal;
a third switching device having a control input for receiving a second select signal, a signal input for receiving the test signal, and a signal output coupled to the second terminal of the second DUT; and
a fourth switching device having a control input for receiving a complement of the second select signal, a signal input for receiving the leakage control signal, and a signal output coupled to the signal output of the third switching device.

19. The test circuit of claim 18, further comprising:
a fifth switching device coupled between the first switching device and the terminal of the first DUT, having a signal input coupled to the signal output of the first switching device, a signal output coupled to the terminal of the first DUT, and a control input for receiving the first select signal; and
a sixth switching device coupled between the third switching device and the terminal of the second DUT, having a signal input coupled to the signal output of the third switching device, a signal output coupled to the terminal of the second DUT, and a control input for receiving the second select signal.

20. The test circuit of claim 19, wherein:
the first, second, third, fourth, fifth, and sixth switching devices are each further characterized as having a complementary control input;
the complementary control inputs of the first and fifth switching devices are for receiving a complement of the first select signal;
the complementary control inputs of the third and sixth switching devices are for receiving a complement of the second select signal;
the complementary control input of the second switching device is for receiving the first select signal; and
the complementary control input of the fourth switching device is for receiving the second select signal.

* * * * *